United States Patent [19]

Shin et al.

[11] Patent Number: 4,948,990
[45] Date of Patent: Aug. 14, 1990

[54] BICMOS INVERTER CIRCUIT

[75] Inventors: Yun-Seung Shin, Seoul; Sung-Ki Min, Incheon, both of Rep. of Korea

[73] Assignee: Samsung Electronics Co., Ltd., Suwon, Rep. of Korea

[21] Appl. No.: 292,883

[22] Filed: Jan. 3, 1989

[30] Foreign Application Priority Data

Apr. 21, 1988 [KR] Rep. of Korea .................. 88-4540

[51] Int. Cl.⁵ .................. H03K 19/02; H03K 19/017; H03K 19/094
[52] U.S. Cl. .................. 307/446; 307/448; 307/451
[58] Field of Search .................. 307/443, 445, 446, 448, 307/451, 570

[56] References Cited

U.S. PATENT DOCUMENTS 4,813,020 3/1989 Iwamura et al. .................. 307/446

Primary Examiner—Stanley D. Miller
Assistant Examiner—Margaret Rose Wambach
Attorney, Agent, or Firm—Ladas & Parry

[57] ABSTRACT

A BiCMOS inverter circuit having complementary MOS transistors and complementary bipolar transistors enables a high speed inverting operation as well as high degree of integration when it is fabricated on a semiconductor chip. The inverter circuit may further include another complementary MOS transistors to allow the logic output to be advantageously full switched in the range of $V_{cc}-0$ V keeping the high speed operation.

1 Claim, 2 Drawing Sheets

BICMOS INVERTER CIRCUIT

BACKGROUND OF THE INVENTION

1. Field of the invention

This invention relates to an inverter logic circuit employing BiCMOS elements.

2. Description of the Prior Art

FIG. 1 shows a conventional CMOS inverter which is comprised of P and N type MOS transistors $M_{11}$ and $M_{12}$ having MOS transistors $M_{13}$ and $M_{14}$ and transistors $Q_1$ and $Q_2$ connected thereto.

In the CMOS inverter circuit as shown in FIG. 1, if an input signal 11 is high, the MOS transistor $M_{12}$ is turned on. Then, the base of the transistor $Q_1$ becomes low to maintain the transistor $Q_1$ off. At the same time, the MOS transistor $M_{13}$ is turned on to provide a bias to the base of the transistor $Q_2$ and turns the transistor $Q_2$ on, whereby the output 14 becomes low while the MOS transistor $M_{14}$ is turned off to eliminate the direct driving of current through the MOS transistors $M_{13}$ and $M_{14}$ The MOS transistor $M_{14}$ makes the base of the transistor $Q_2$ at ground potential only when the output 14 is high.

On the other hand, if the input 11 is low, the MOS transistor $M_{11}$ is turned on to provide a bias to the base of the transistor $Q_1$ so that since the output 14 is maintained at a high level, the MOS transistor $M_{14}$ is turned on.

In the prior inverter circuit, however, as the input 11 is changed from the low level, with the MOS transistor $M_{13}$ off and the MOS transistor $M_{14}$ on, to the high level, the transistor $Q_1$ is turned off and the MOS transistor $M_{13}$ is turned on. Thus, the MOS transistors $M_{13}$ and $M_{14}$ are simultaneously turned-on before the output 14 becomes low (i.e. during the high level of the output), which delays the turn-on of the transistor $Q_2$ and adversely affects the high speed operation of the circuit.

This delay of switching time also appears when the input 11 is changed from high to low.

A further problem of prior known inverters is that they are complex which interferes with a high degree of integration.

SUMMARY OF THE INVENTION

It is an object of the present invention to provide a simple BiCMOS inverter circuit which enables a high operational speed as well as a high degree of integration when it is fabricated on a semiconductor chip.

This object is achieved by the BiCMOS inverter circuit of the present invention comprising four complementary MOS transistors connected to an input terminal and two complementary bipolar transistors having a logic output connected thereto improving the switching speed of the MOS transistor circuit where the capacitance loading is heavy.

Other objects and advantages will become apparent during the following description of the presently preferred embodiment of the invention taken in conjunction with the drawings.

DESCRIPTION OF THE PREFERRED EMBODIMENT

The inverter circuit of the present invention is hereinafter described with reference to FIG. 3. The following description of the prior art circuit shown in FIG. 2 will assist in the understanding of the FIG. 3 circuit.

Figure 1:
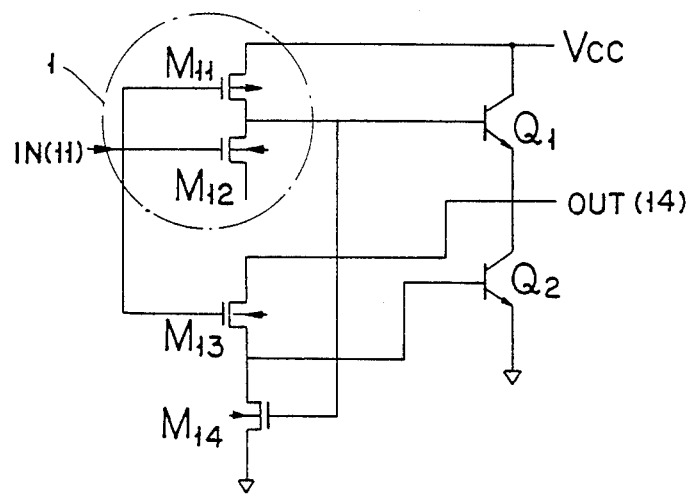
FIG. 1 shows a prior art CMOS inverter circuit.
Figure 2:
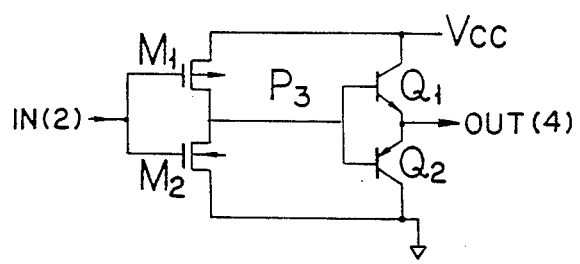
FIG. 2 shows a schematic diagram of another prior art BiCMOS inverter circuit.

As shown in FIG. 2, a logic input IN 2 is applied to the gates of MOS transistors $M_1$ and $M_2$ connected in series with each other. The drains of the MOS transistors $M_1$ and $M_2$ are connected at a node $P_3$ which is connected to the bases of bipolar transistors $Q_1$ and $Q_2$. The emitters of the bipolar transistors are connected with each other and lead to a logic output 4. The collector of the transistor $Q_1$ is connected to the power source $V_{cc}$ together with the source of the MOS transistor $M_1$. The collector of the transistor $Q_2$ is connected with the source of the MOS transistor $M_2$.

In FIG. 2, the output 4 voltage swing equals $(V_{cc} - V_{T.NPN}) - V_{T.PNP}$, where $V_{T.NPN}$ and $V_{T.PNP}$ are the base-emitter turn on voltages of the bipolar transistors $Q_1$ and $Q_2$.

Figure 3:
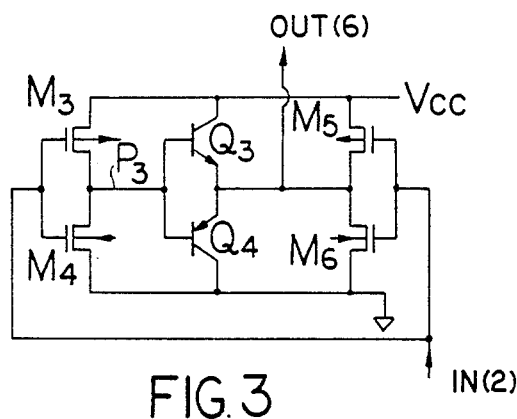
FIG. 3 is an embodiment of the BiCMOS inverter circuit of the present invention.

FIG. 3 is an embodiment of the present invention wherein an inverter circuit such as shown in FIG. 2 and composed of MOS transistors $M_3$ and $M_4$ having bipolar transistors $Q_3$ and $Q_4$ connected thereto further includes MOS transistors $M_5$ and $M_6$ connected in series with each other. The gates of the MOS transistors $M_5$ and $M_6$ are connected to an input 2 which is also connected to the gates of the MOS transistors $M_3$ and $M_4$ The drains of the P and N type MOS transistors $M_5$ and $M_6$ are connected to an output 6. A source of the P type MOS transistor $M_5$ is connected to the collector of the transistor $Q_3$ and to the voltage source. The source of the N type MOS transistor $M_6$ is connected to ground. With the inverter circuit of this embodiment, the output 6 level is advantageously fully switched in the range of $V_{cc} - 0$ V.

Figure 4:
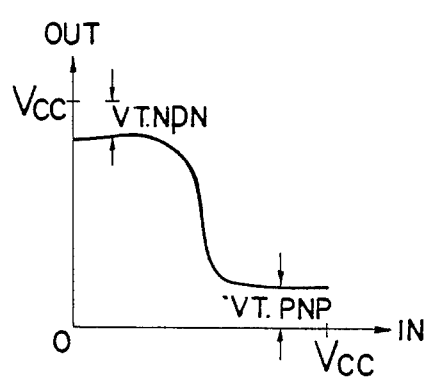
FIG. 4 is a graph showing a switching characteristic of the BiCMOS inverter circuit of FIG. 2.
Figure 5:
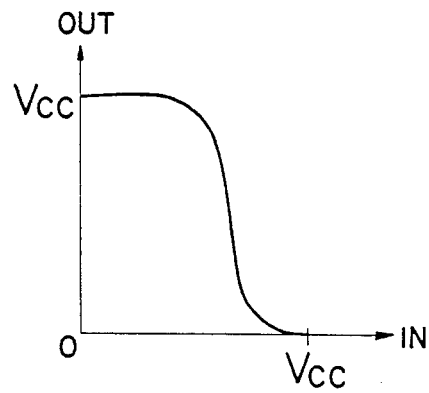
FIG. 5 is a graph showing a switching characteristic of the BiCMOS inverter circuit of FIG. 3.

Operation of the inverter circuit of FIG. 2 is described with reference to FIG. 4.

In FIG. 2, if the input 2 is low the MOS transistor $M_1$ is turned on to change the node $P_3$ to high so that the transistor $Q_1$ is turned on and the transistor $Q_2$ is turned off whereby the output 4 becomes high.

On the other hand, if the input 2 is high, the node $P_3$ becomes low so that the transistor $Q_1$ is turned off and the transistor $Q_2$ is turned on whereby the output 4 becomes low. Therefore, the BiCMOS inverter circuit composed of a CMOS inverter and NPN and PNP transistors achieves high operational speed.

The embodiment of the present invention shown in FIG. 3 further includes P and N type MOS transistors $M_5$ and $M_6$ connected to the FIG. 2 inverter in parallel thereto which allows the full swing of the output 6 level in the range of 0 to $V_{cc}$. That is, the inverter circuit of FIG. 2 shows the switching characteristic shown in FIG. 4 which means the low input level maintains the output level high but below $V_{cc} - V_{T.NPN}$.

Advantageously, the inventive embodiment shown in FIG. 3 is capable of raising the output 6 voltage up to $V_{cc}$, and in case of a high level of input 2, the MOS transistor $M_6$ is turned on so that the output 6 is lowered to ground level. The transistors $Q_1$, $Q_2$, $Q_3$ and $Q_4$ used are operative always in active and cutoff regions which improves the operational speed of the bipolar transistors.

Therefore, according to the present invention, a high speed switching operation is obtained by providing an inverter circuit composed of CMOS transistors having a bipolar circuit including NPN and PNP transistors connected thereto, and the decrease of operational speed in conventional MOS circuits is eliminated effectively due to the bipolar transistors at the output side.

A high integration of the inverter when it is fabricated on a semiconductor chip can easily be obtained due to the simplicity in configuration of the circuit.

The invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A BICMOS inverter circuit comprising:
an input for receiving a high or low signal;
a first P type MOS transistor having a gate connected to said input, a source adapted to be connected to the positive terminal of a voltage source, and a drain connected to a signal output node;
a first N type MOS transistor having a gate connected to said input, a source adapted to be connected to the negative terminal of said voltage source, and a drain connected to said signal output node;
a first bipolar transistor having an emitter, a base connected to said signal output node, and a collector connected to the source of said first P type MOS transistor;
a second bipolar transistor having a base connected to the base of said first bipolar transistor, an emitter connected to the emitter of said first bipolar transistor, and a collector connected to the source of said first N type MOS transistor;
a second P type MOS transistor having a gate connected to said input, a source connected to the source of said first P type MOS transistor, and a drain connected to the emitter of said first bipolar transistor;
a second N type MOS transistor having a gate connected to said input, a source connected to the source of said first N type MOS transistor, and a drain connected to the emitter of said first bipolar transistor; and
a logic gate output connected to the emitter of said first bipolar transistor.

* * * * *